United States Patent [19]

Phelps et al.

[11] 4,011,435
[45] Mar. 8, 1977

[54] OPTICAL INDICIA MARKING AND DETECTION SYSTEM

[75] Inventors: Robert A. Phelps, Kettering; William R. Horst, Dayton, both of Ohio

[73] Assignee: NCR Corporation, Dayton, Ohio

[22] Filed: Feb. 1, 1974

[21] Appl. No.: 438,886

[52] U.S. Cl. .................. 235/61.11 E; 340/146.3 P; 340/173 LM

[51] Int. Cl.² ...................... G06K 7/14; G06K 9/04; G11C 11/44

[58] Field of Search .............. 340/173 LS, 173 LM, 340/173 LT, 146.3 P, 149 A; 235/61.11 E, 61.7 B, 61.12 N, 61.12 R; 250/566, 568, 570, 569

[56] References Cited

UNITED STATES PATENTS

| | | | |
|---|---|---|---|
| 3,305,834 | 2/1967 | Cooper | 340/173 LT |
| 3,312,955 | 4/1967 | Lamberts | 340/173 LM |
| 3,314,052 | 4/1967 | Lohmann | 340/173 LM |
| 3,417,231 | 12/1968 | Stites | 235/61.11 E |
| 3,437,824 | 4/1969 | Lohmann | 340/146.3 P |
| 3,492,660 | 1/1970 | Halverson | 340/173 LM |
| 3,552,853 | 1/1971 | Sanders | 340/146.3 P |
| 3,571,603 | 3/1971 | Bryant | 340/146.3 P |
| 3,735,374 | 5/1973 | Rembault | 340/146.3 P |
| 3,737,877 | 6/1973 | Feinleib | 340/173 LM |
| 3,819,911 | 6/1974 | Greenaway | 340/146.3 P |

*Primary Examiner*—Daryl W. Cook
*Assistant Examiner*—Robert M. Kilgore
*Attorney, Agent, or Firm*—J. T. Cavender; Albert L. Sessler, Jr.; Elmer Wargo

[57] ABSTRACT

An optical marking system which utilizes tags that are formed from multiple diffraction gratings, which gratings differ in orientation and number of lines (frequency) in accordance with the coded information desired on the tags. A monochromatic light source illuminates a diffraction grating tag, with reading of the coded information on the tag being accomplished by sensing the reflected light which is projected as images in a Fraunhofer plane. Retroreflective elements are provided in the optic train as a means for stabilizing the direction of reflection from the diffraction gratings such that the reflections are somewhat independent of the tilt angle of the tag with respect to the illuminating light.

4 Claims, 7 Drawing Figures

OPTICAL INDICIA MARKING AND DETECTION SYSTEM

BACKGROUND OF THE INVENTION

This invention relates to a system which utilizes selected combinations of diffraction gratings as a means for forming indicia on tags or like labeling material for use in marking price, inventory number, routing instructions, and the like in merchandising operations while simultaneously providing a tag or label which can be effectively read at different angles. A number of different systems and arrangements have been used over the years to enable machine reading of such tags or labels, two of the most recent being the bar code arrangement and the bullseye arrangement.

A review of prior art in the area of indicia marking systems shows that in U.S. Pat. No. 3,312,955, entitled "System for Recording and Retrieving Digital Information", to R. L. Lamberts, et al., there is disclosed a system which is first used to convert a combination of electrical signals representative of an item of information into a grating pattern on an optical material and is then later used to decode the pattern. Multiple positions of the pattern are created by orientating the grating at different angles during the construction of the grating pattern.

An additional prior art device of interest is disclosed in U.S. Pat. No. 3,314,052, entitled "Light Modulation System", to A. W. Lohmann wherein there is shown and described a light modulation system which system operates upon the angular orientation of a diffraction grating to impart information.

In U.S. Pat. No. 3,525,566, entitled "Projection Devices and Materials Therefor", to G. Altman there is disclosed an optical projector for imaging a subject in terms of reflected light using an array of optical elements, which array is comprised of a plurality of reflex reflectors, and a focusing system for controlling the illuminating light directed to the subject and for imaging the light reflected by the array.

Several other patents of interest in the reflex reflector art are U.S. Pat. No. 2,326,634, entitled "Reflex Light Reflector" to M. C. Gebhard et. al.; U.S. Pat. No. 2,407,680, entitled "Reflex Light Reflector", to P. V. Palmquist; U.S. Pat. No. 2,440,584, entitled "Lenticular Reflex Reflector Sheet And Method Of Making The Same", to H. Heltzer et. al., and U.S. Pat. No. 2,713,286, entitled "Reflex Light Reflectors and Glass Bead Elements Thereof", to N. W. Taylor.

While the above mentioned prior art suggests various ways and means for utilizing diffraction gratings and reflex reflectors for carrying information, it is desirable that certain improvements be made in the prior art devices so as to provide a more commercially utilizable device.

SUMMARY OF THE INVENTION

In the present invention an optical system utilizes multiple diffraction gratings having angular orientations and line spacings that are a function of desired indicia in combination with retroreflective surfaces to provide as an example, a machine readable merchandise tag. The concept of coding in this application is based on the far-field diffraction patterns obtained when combinations of gratings with preselected orientations and line spacings (frequencies) are illuminated with coherent light. A set of diffraction gratings is established wherein patterns are formed in accordance with a desired code. The patterns need not be symmetrically arranged as to orientation or position in a prescribed plane. Coding may be accomplished in preprinted tags by obliterating specific gratings. This can be accomplished, for example, during the marking process through overprinting. Coding may also be accomplished by impression printing on a suitable material the lines of the diffraction grating. The material can then be placed either on a tag or directly on the article to be marked. A specific coding is thus represented by a specific arrangement of images in the diffraction pattern, which images in turn are associated with the angular orientations and line spacings of the gratings. For example, one image can be used to indicate the beginning of an information line, with other images indicating, by their presence or by their absence (as a result of overprinting or non-printing of particular gratings), the bit structure of the marked information.

The images and, in turn, the information contained in the images may be automatically read by utilizing radially oriented slots in a rotating disc, with the disc located in the focal plane of the optical system. A photodetector is used to pick up the images and to convert the images into associated electrical signals. Because of the Fourier transform properties of the lens arrangement, the pattern at the plane of the rotating disk will be invariant as the tag (indicia) is moved in a direction transverse to the systems optical axis; this will occur for so long as the diffraction orders fall within the aperture of the input disc. Within the same limitation, movement of the tag in a direction parallel to the system's optical axis will not change the information pattern.

The invention also utilizes retroreflective elements to provide for a reading of the tags by reflected light for those cases in which the diffraction pattern is critically sensitive to rotation of the tag about an axis perpendicular to the optical axis. The retroreflector used in one embodiment of the invention includes a sheet of material over which is coated a layer of reflective material and a layer of small glass beads having a high refractive index.

In view of the above it can be seen that it is a principal object of the present invention to provide a marking system based on the use of multiple diffraction gratings and a retroreflective element.

A further object of the present invention is to provide a system for stabilizing the image of a merchandising tag to allow for a relatively simple scanning technique and relaxed constraints on the movement and position of the merchandising tag.

An additional object of the present invention is to provide a marking system wherein the location of the marking tag on an article is not critical.

These and other objects of the present invention will become more apparent and better understood when taken in conjunction with the following description and drawings, wherein like characters indicate like parts, and which drawings form a part of this application.

DESCRIPTION OF THE PREFERRED EMBODIMENTS

Figure 1:
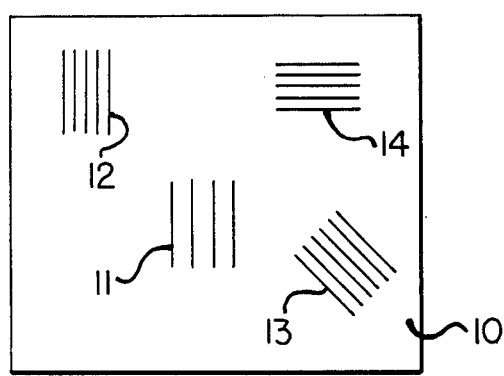
FIG. 1 illustrates some possible orientations of the diffraction gratings as used on a tag.
Figure 2:
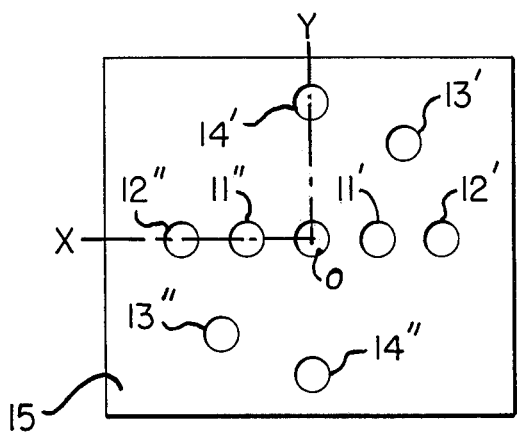
FIG. 2 illustrates the diffraction pattern that is obtained from the diffraction gratings of FIG. 1.

Referring to FIG. 1, a sheet of diffraction grating material 10 has formed thereon a plurality of gratings labeled 11 through 14. Each grating has a line spacing indicative of a particular code, for example, a bit. The angular orientation of the grating uniquely locates the position of the bit in the diffraction pattern. In FIG. 2 the diffraction pattern 15 is generated by illuminating the set of gratings of FIG. 1 with a parallel monochromatic light. The generated pattern of images thus formed is symmetrical around the point labeled (0), which point corresponds to the zero interference order. As is well known in the prior art, when a source of coherent light passes through a diffraction grating, a central image is formed together with higher interference orders. The distance between the interference orders is dependent on the frequency of the light and the spacing of the lines in the grating. Assuming that the light source is of a constant frequency, then the smaller the grating interval the more divergent are the interference orders.

The intensity of the light in the various orders is dependent upon the characteristics of the grating, and as is well known in the prior art, a grating can be fabricated so that one particular order predominates. In the present invention the order of major interest is the first order. Comparing the gratings of FIG. 1 against the generated images in FIG. 2, on a one to one basis, we find that the lines of grating 11 are substantially vertical, that is, they lie along an imaginary Y-axis. The image of grating 11 in the Fraunhofer plane is comprised of the zero order, and two equally and symmetrically spaced first order intensity spots 11' and 11" positioned along an X-axis. The grating 12, which has its lines substantially along the Y-axis forms a zero ordered image along with the first order images 12' and 12" which images are further displaced from the zero ordered image than images 11' and 11". This occurs because the grating 12 is of a higher frequency than grating 11, that is, it has a greater density of lines.

Grating 13 has its lines angularly oriented with respect to the lines of gratings 11, 12 and 14. Its first order images 13' and 13" appear in the Fraunhofer plane along an axis which is perpendicular to the lines forming the grating.

Grating 14 has its lines substantially horizontal which causes its first order images 14' and 14" to be formed along a vertical line (Y-axis). From the foregoing it can be seen that a unique group of images can be formed which images may be representative of a unique group of information bits.

Figure 3:
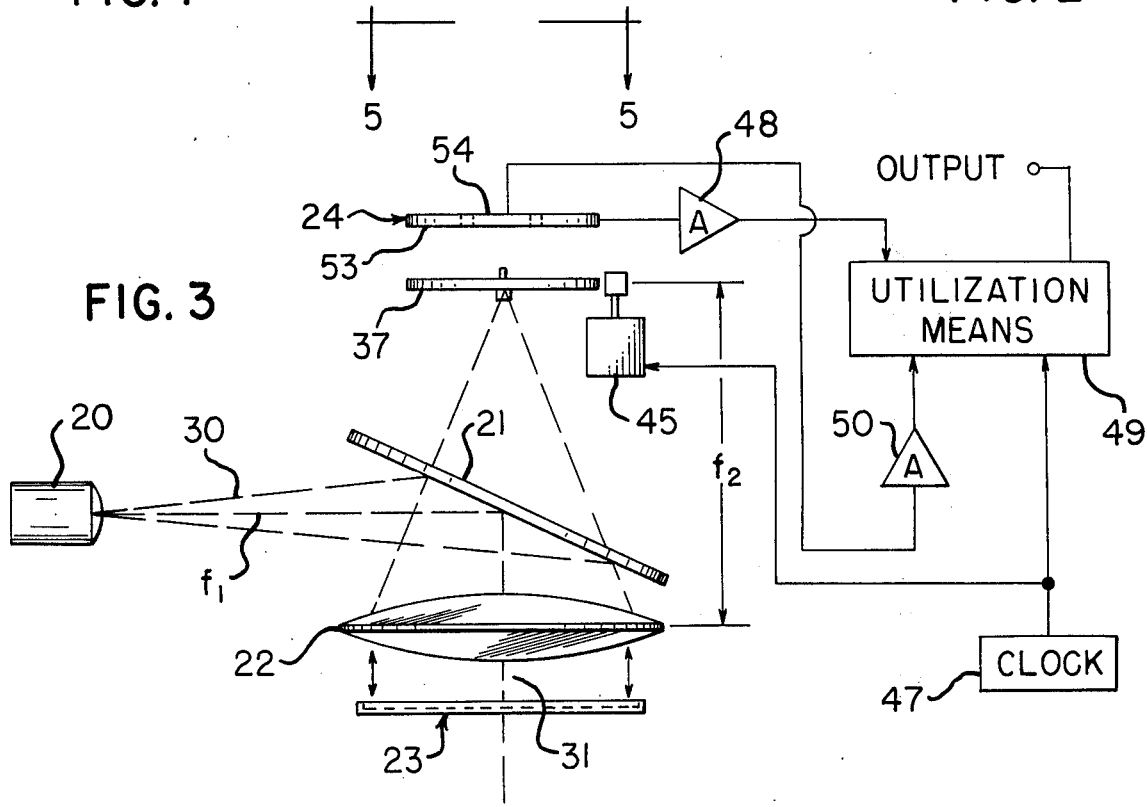
FIG. 3 illustrates a first preferred embodiment of the invention.
Figure 6:
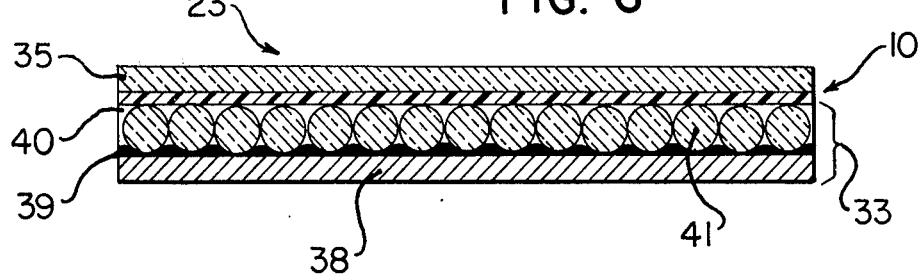
FIG. 6 illustrates a marking tag which may be used with the first and a second embodiment of the invention.

In FIG. 3 a first preferred embodiment of the invention is shown utilizing a monochromatic point source of light 20 which source may be a laser having a diverging lens positioned in its beam path, a beam splitter 21, a collimating lens 22, an indicia (merchandise) tag 23, a rotating disc 37 and a photodetector 24. The collimating lens 22 is located a distance $f_2$ from the plane of the rotating disc 37, which distance corresponds to the focal length of lens 22. The point source 20 is located a distance $f_1$ from the lens 22. If the lens used is symmetrical the distance $f_1$ can be made equal to $f_2$. In operation the point source 20 provides a beam of monochromatic light 30 which beam is deflected to the collimating lens 22 by the beam splitter 21. The beam splitter may be a partially silvered mirror. The reflected beam from the beam splitter passes through the collimating lens to the indicia tag 23. The tag 23 is shown in FIG. 6 as being comprised of a layer of retroreflective material 33 onto which is affixed a layer 10 containing the desired gratings. A transparent layer 35 of plastic material may be affixed over the grating layer to provide physical protection and/or rigidity to the structure. The retroreflective material 33 may be comprised of a support layer 38 onto which a layer of reflective material 39 is bonded and a layer of transparent glass beads 41 is bonded to the reflector layer 39 by means of a transparent bonding material 40. The retroreflective material 33 may be formed from high-gain reflective sheeting of the type manufactured by the 3M Company under the trademark of "Scotchlite", Stock No. 7610. Retroreflective material has the unique property of reflecting incident light back along the angle of incidence.

The reflected beam from the beam splitter 21 passes through the transparent layer 35 and through the grating layer 10. The retroreflector layer returns the light which has passed through the grating back through the grating along a path substantially parallel to the path it took through the grating on the first pass.

Figure 4:
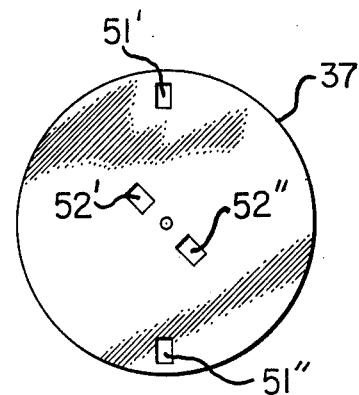
FIG. 4 illustrates the apertured disk which forms a part of the first and a second embodiment of the invention.
Figure 5:
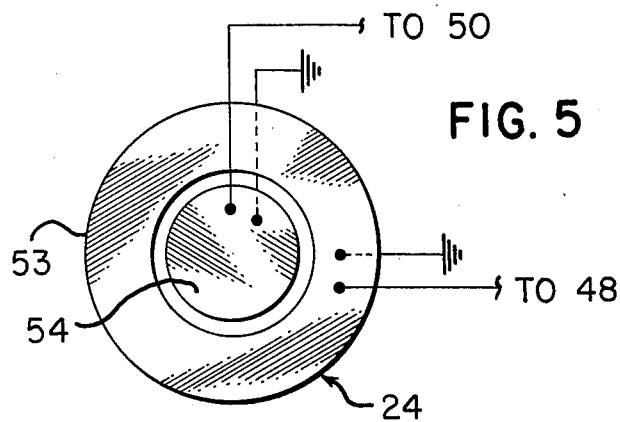
FIG. 5 illustrates a photocell arrangement which may be used with the first and a second embodiment of the invention.

The reflected light is then focused by lens 22 onto the rotating disc 37, which is placed in the Fraunhofer plane at the focal distance $f_2$ of the lens 22. The disc 37 is rotated by motor 45 in synchronism with the clock signal from the clock source 47. Disc 37, referring to FIG. 4, contains two pairs of apertures 51' - 51" and 52' - 51". As the disc rotates it will expose any images that are present in the Fraunhofer plane at a radial distance which corresponds to the radial distance of the apertures. The exposed images will then fall on the photodetector 24. In FIG. 5 there is illustrated a photodetector which is effective for detecting the images shown in FIG. 2. Other configurations of photodetectors and combinations of photodetectors and lenses can be utilized to provide the desired sensing pattern. The photodetector is formed of a ring 53 and an inner disc 54. The apertures 51' - 51" of disc 37 are positioned at a radius corresponding to images 12' - 12", 13' - 13" and 14' - 14", and pass the light from the images to the ring 53. The apertures 52' - 52" are positioned at a radius corresponding to images 11' - 11" and pass the light from the images to the inner disc 54. The number of different interference orders to be detected determines the number of apertures formed in the disc and their radial positions on the disc and also the number of photodetector rings and their positions with respect to the disc. The apertures are shown in pairs because increased signal strength is obtained by using both of the interference images to activate the corresponding photocell. A single aperture at each desired radius could also be used effectively. The photodetector would then provide two separated indications of the sensing of an image rather than one, because each image of a pair would be scanned sequentially rather than simultaneously. The electrical signals from the photodetector elements 53 and 54 are fed to an amplifier means 48 and 50 respectively. The signals are amplified and fed to an appropriate utilization means 49 such as an oscilloscope. The clock signal from the clock source 47 is also fed to the utilization means 49. If an oscilloscope is used as the utilization means 49, the signal from amplifier 50 can be fed to the horizontal sweep trigger circuit so as to cause a horizontal sweep of the oscilloscope beam to occur each time a signal is generated by the apertures 52' - 52" passing over the images 11' - 11".

The vertical input of the oscilloscope can be connected to receive the clock signal from source 47 and the output from amplifier 48. In operation the angular position of the tag 23 can be angularly random around the axis of the beam 31 because a reference position can always be found from the indicated position of a selected reference image such as image 11' - 11". The signal on the scope will then have a plurality of evenly spaced vertical clock pulses, the number of which corresponds to the amount of rotation of the disc 37 from the index position. The occurrence of a signal from amplifier 48 will provide additional vertical signals on the scope which signals will be superimposed on the clock signal. The number of clock pulses occurring between the start of the horizontal sweep and the display of the signals from amplifier 48 will uniquely define the angular orientation of the gratings on the tag 10 with respect to the orientation of the reference grating. The use of an oscilloscope is by way of example only as a digital logic system may obviously be used to provide direct decoding and display of the decoded data.

The photoelectric detection scheme illustrated works for two gratings of differing frequency line spacing and angular positioning, one grating being the reference position grating and the others the information gratings. Further modifications may be made to extend the number and type of gratings used. Such modifications would extend the amount of information which could be stored on the tag. One obvious modification can be made by substituting for the rotating disc a plate of frosted glass, and removing the photodetector 24 so as to allow viewing of the images directly. The image created by a tag of the configuration set forth in FIG. 1, would then be viewed as in FIG. 2.

Figure 7:
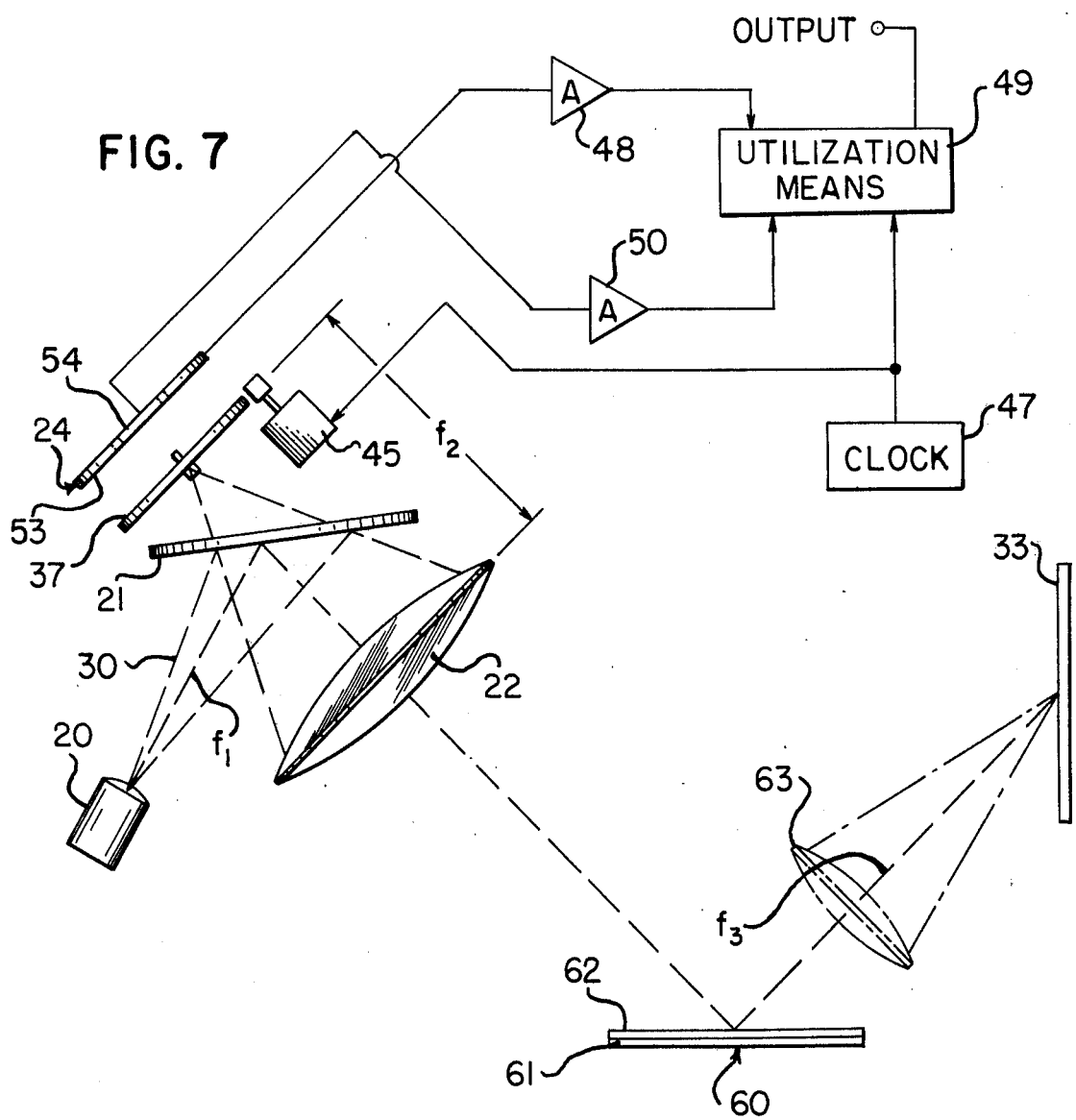
FIG. 7 illustrates a second embodiment of the invention.

Reference may now be had to FIG. 7, wherein a second embodiment of the invention is shown which is similar to the first embodiment except for the merchandise tag 60 which contains only the diffraction gratings and a reflective coating, the retroreflective material now being a part of the reading system and separate from the tag. Each of the grating elements on the tag may be made of a reflecting grating material, such as Reflecting Replica Grating Film, manufactured by Edmund Scientific Co. under their stock No. 50201. A supporting layer of plastic 61 may be used to add physical strength to the grating material 62. The retroreflective element 33 is positioned in the optical path of the light reflected from the grating 60 so as to re-reflect the light back along a path parallel to the received light. By removing the retroreflective material from the tag and positioning it permanently in the optical path of the machine there is a substantial savings obtained in the cost of the tag. An improved output image may be achieved by inserting a collimating lens 63 into the optical path between the tag 60 and the retroreflective material 33, one focal length $f_3$ removed from the retroreflective surface of material 33.

While there have been shown what are considered to be the preferred embodiments of the invention, it will be manifest that many changes and modifications may be made therein without departing from the essential spirit of the invention. It is intended, therefore, in the annexed claims to cover all such changes and modifications as may fall within the true scope of the invention.

What is claimed is:

1. An optical identification system comprising:
   optical indicia members each including a plurality of singularly distinguishable diffraction grating elements overlaying a retroreflective element in a multiple layer structure with each of said diffraction grating elements having a selected line spacing and angular orientation, which spacing and orientation corresponds to a selected code;
   indicia classifying apparatus including a source of coherent light capable of illuminating a viewed indicia member, and light sensing means responsive to a plurality of light images produced by said diffraction grating elements of said viewed indicia member for converting said images into usable code signals.

2. The optical identification system of claim 1 wherein said indicia classifying apparatus includes at least one optical lens element located optically between said viewed indicia member and said light sensing means for focusing images on said light sensing means.

3. The optical identification system according to claim 1 wherein one of said diffraction grating elements is a reference element and further comprising, means for determining the relative positions of images produced by the remaining grating elements with respect to the position of the image produced by said reference element, such that the positions of the produced images impart information.

4. An optical identification system comprising in combination:
   an optical indicia member having a plurality of distinct diffraction grating elements incorporated therein with each of said elements having a selected line spacing and angular orientation, which spacing and orientation correspond to a selected code and retroreflective element means integral with said optical indicia member for concentrating light impinging upon said optical indicia member into a confined path having a location and an orientation that are generally non-responsive to the tilting of said optical indicia member with respect to a source of light;
   indicia reading apparatus including a source of light capable of illuminating said optical indicia member, an image receiving plane positioned to receive light images from said viewed optical indicia member and light sensing means communicating with said image receiving plane for receiving and converting into information code signals a plurality of light images from said optical indicia member.

* * * * *